(12) United States Patent
Wang et al.

(10) Patent No.: US 8,806,397 B2
(45) Date of Patent: *Aug. 12, 2014

(54) METHOD AND DEVICE FOR INCREASING FIN DEVICE DENSITY FOR UNALIGNED FINS

(71) Applicant: Taiwan Semiconductor Manufacturing Company, Ltd., Hsinchu (TW)

(72) Inventors: Chien-Hsun Wang, Hsinchu (TW);
Chih-Sheng Chang, Hsinchu (TW);
Yi-Tang Lin, Hsinchu (TW);
Ming-Feng Shieh, Yongkang (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/018,133

(22) Filed: Sep. 4, 2013

(65) Prior Publication Data
US 2014/0013288 A1    Jan. 9, 2014

Related U.S. Application Data

(63) Continuation of application No. 13/227,809, filed on Sep. 8, 2011.

(60) Provisional application No. 61/412,846, filed on Nov. 12, 2010.

(51) Int. Cl.
*G06F 17/50*    (2006.01)

(52) U.S. Cl.
USPC .......................................................... 716/55

(58) Field of Classification Search
CPC ............ H01L 27/0207; H01L 27/0886; H01L 21/823431; H01L 29/66795; H01L 29/785; H01L 21/845; H01L 27/1211; H01L 27/0924; H01L 21/823821

USPC .......................................................... 716/55
See application file for complete search history.

(56) References Cited

U.S. PATENT DOCUMENTS 5,581,202 A    12/1996    Yano et al.
5,767,732 A    6/1998    Lee et al.
(Continued)

FOREIGN PATENT DOCUMENTS

CN    1945829    4/2004
CN    101179046    5/2005
(Continued)

OTHER PUBLICATIONS

Office Action dated May 2, 2012 from corresponding application No. CN 201010196345.0.
(Continued)

*Primary Examiner* — Vuthe Siek
*Assistant Examiner* — Aric Lin
(74) *Attorney, Agent, or Firm* — Lowe Hauptman & Ham, LLP (57) ABSTRACT

A method of generating a layout for a device includes receiving a first layout including a plurality of active regions, each active region of the plurality of active regions having sides. The method further includes defining a plurality of elongate mandrels that each extend in a first direction and are spaced apart from one another in a second direction perpendicular to the first direction. The method further includes for each adjacent pair of partially-parallel active regions of the plurality of active regions having a minimum distance less than a specified minimum spacing, connecting at least a portion of nearest ends of pairs of elongate mandrels, each mandrel of a pair from a different active region. The method further includes generating a second layout including a plurality of elongate mandrels in the plurality of active regions, and connective elements between active regions of at least one adjacent pair of active regions.

20 Claims, 7 Drawing Sheets

(56) References Cited

U.S. PATENT DOCUMENTS

| | | |
|---|---|---|
| 5,949,986 A | 9/1999 | Riley et al. |
| 5,963,789 A | 10/1999 | Tsuchiaki |
| 6,121,786 A | 9/2000 | Yamagami et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |
| 6,727,557 B2 | 4/2004 | Takao |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,298,600 B2 | 11/2007 | Takikawa et al. |
| 7,300,837 B2 | 11/2007 | Chen et al. |
| 7,323,375 B2 | 1/2008 | Yoon et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,538,391 B2 | 5/2009 | Chidambarrao et al. |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2002/0144230 A1 | 10/2002 | Rittman |
| 2003/0080361 A1 | 5/2003 | Murthy et al. |
| 2003/0109086 A1 | 6/2003 | Arao |
| 2003/0145299 A1 | 7/2003 | Fried et al. |
| 2003/0234422 A1 | 12/2003 | Wang et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0063276 A1* | 3/2007 | Beintner et al. .............. 257/347 |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |

(56) References Cited

U.S. PATENT DOCUMENTS

| | | | |
|---|---|---|---|
| 2009/0166625 | A1 | 7/2009 | Ting et al. |
| 2009/0181477 | A1 | 7/2009 | King et al. |
| 2009/0200612 | A1 | 8/2009 | Koldiaev |
| 2009/0239347 | A1 | 9/2009 | Ting et al. |
| 2009/0309162 | A1 | 12/2009 | Baumgartner et al. |
| 2009/0321836 | A1 | 12/2009 | Wei et al. |
| 2010/0155790 | A1 | 6/2010 | Lin et al. |
| 2010/0163926 | A1 | 7/2010 | Hudait et al. |
| 2010/0183961 | A1 | 7/2010 | Shieh et al. |
| 2010/0187613 | A1 | 7/2010 | Colombo et al. |
| 2010/0207211 | A1 | 8/2010 | Sasaki et al. |
| 2010/0308379 | A1 | 12/2010 | Kuan et al. |
| 2011/0018065 | A1 | 1/2011 | Curatola et al. |
| 2011/0108920 | A1 | 5/2011 | Basker et al. |
| 2011/0129990 | A1 | 6/2011 | Mandrekar et al. |
| 2011/0195555 | A1 | 8/2011 | Tsai et al. |
| 2011/0195570 | A1 | 8/2011 | Lin et al. |
| 2011/0256682 | A1 | 10/2011 | Yu et al. |
| 2012/0086053 | A1 | 4/2012 | Tseng et al. |
| 2012/0124528 | A1* | 5/2012 | Wang et al. ............ 716/52 |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 4, 2012 from corresponding application No. CN 201010243667.6.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Shikida, Mitsuhiro et al., "Comparison of Anisotropic Etching Properties Between KOH and TMAH Solutions", Depto. of Micro System Engineering, Nagoya University, Chikusa, Nagoya, 464-8603, Japan, IEEE Jun. 30, 2010, pp. 315-320.

Lenoble, Damien, "Plasma Doping as an Alternative Route for Ultra Shallow Junction Integration to Standard CMOS Technologies", STMicroelectronics, Crolles Cedex, France, Semiconductor Fabtech, 16th Edition, pp. 1-5.

Chui, King-Jien et al., "Source/Drain Germanium Condensation for P-Channel Strained Ultra-Thin Body Transistors", Silicon Nano Device Lab, Dept. of Electrical and Computer Engineering, National University of Singapore, IEEE 2005.

Anathan, Had, et al., "FinFet SRAM—Device and Circuit Design Considerations", Quality Electronic Design, 2004, Proceedings 5th International Symposium (2004); pp. 511-516.

Jha, Niraj, Lowe-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

\* cited by examiner

METHOD AND DEVICE FOR INCREASING FIN DEVICE DENSITY FOR UNALIGNED FINS

PRIORITY CLAIM

The present application is a continuation of U.S. application Ser. No. 13/227,809, filed Sep. 8, 2011, which claims priority of U.S. application Ser. No. 61/412,846, filed Nov. 12, 2010, both of which are incorporated herein by reference in their entireties.

RELATED APPLICATIONS

The present application is related to U.S. pat. application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; Ser. No. 61/412,846, filed Nov. 12, 2010, Ser. No. 61/394,418, filed Oct. 19, 2010, titled METHODS OF FORMING GATE DIELECTRIC MATERIAL and Ser. No. 61/405,858, filed Oct. 22, 2010, titled METHODS OF FORMING SEMICONDUCTOR DEVICES; which are incorporated herein by reference in their entireties.

TECHNICAL FIELD

The disclosure relates generally to integrated circuit devices, and more particularly to structure and methods for forming fin field-effect transistors (FinFETs).

BACKGROUND

In the rapidly advancing semiconductor manufacturing industry, complementary metal oxide semiconductor (CMOS) FinFET devices may be used in many logic and other applications and are integrated into various different types of semiconductor devices. FinFET devices typically include semiconductor fins with high aspect ratios in which the channel and source/drain regions for the transistor are formed. A gate is formed over and along the sides of a portion of the semiconductor fins. The increased surface area of the channel and source/drain regions in a FinFET results in faster, more reliable and better-controlled semiconductor transistor devices.

New advanced designs are created with FinFET structures at the outset with computed-aided design (CAD) layers that define the boundary of each FinFET. As manufacturing processes progress into smaller and smaller technology nodes, devices originally designed in a larger technology node may benefit from manufacture in a smaller technology node in ways such as increased performance, increased efficiencies, and decreased die size. Similarly, devices designed using planar transistors can also reap benefits by manufacture using FinFETs. However, because different design rules apply to planar structure layouts and FinFET structure layouts, converting portions of the device from a planar layout to a FinFET layout by hand may be akin to creating a new design, which is a highly resource intensive process few designers would invest in for an older product.

As such, improved methods for automatically converting older planar structure layouts to FinFET structure layouts continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

FinFETs use a substantially rectangular fin structure formed generally in one of two ways. In a first method, bulk silicon on a substrate is etched into rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or a deposited silicon such as silicon-on-insulator (SOI) with a barrier oxide (BOX) layer between the SOI and the underlying silicon substrate.

In a variation of the first method, the hardmask for etching into the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the silicon layers below, forming the fin structures. Using the mandrel/spacer method, thinner fins that are closer together can be formed than an unmodified, conventional first method.

As discussed, a method to automatically convert planar structure layouts to FinFET structure layouts is sought. As discussed above, various performance gains may be garnered by converting a planar transistor to a FinFET. However, for an existing product, the cost of making photomasks for all the layers is very high; hence, it is important to reuse as many photomasks from an existing product as possible. Therefore, it may be necessary to form the FinFETs within the confines of planar transistor structures so that layouts of other layers are not affected. To realize the benefits of using a FinFET structure, the fin density within the confines of planar transistor structures should be maximized. Alternatively, the use of FinFETs and embodiments of the present disclosure may allow the overall layout to decrease in size and hence reduce the size of the die, but with an increased cost of making additional photomasks.

Figure 1:
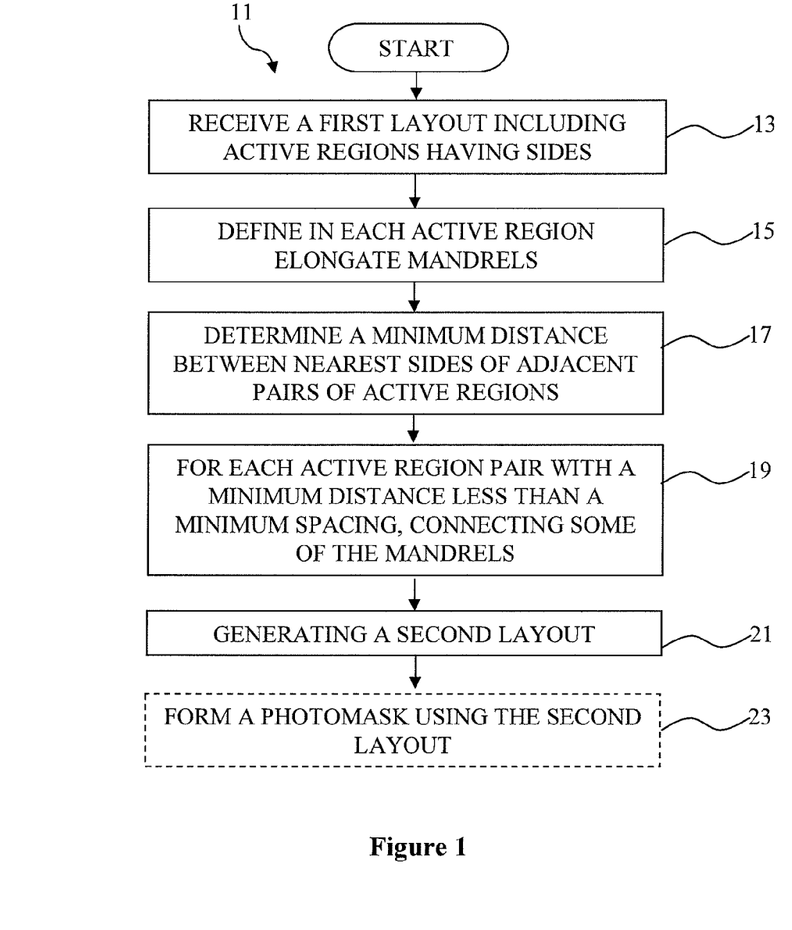
FIG. 1 illustrates a flowchart of a method for converting a planar structure layout to a FinFET structure layout in accordance with certain embodiments of the present disclosure.
Figure 2:
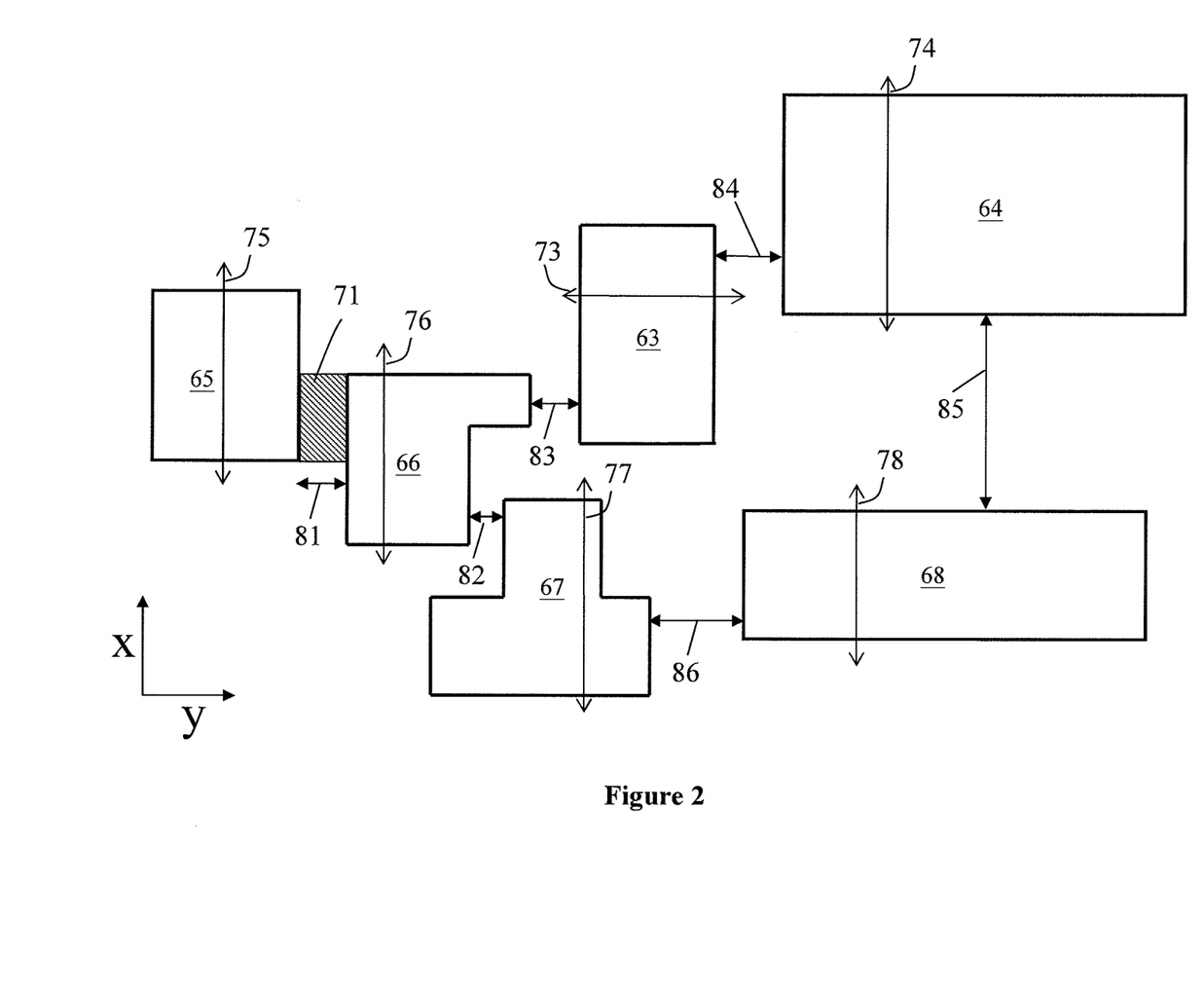
FIG. 2 illustrates a number of active regions on a layout.

FIG. 1 illustrates a semiconductor process flow 11 to manufacture FinFET structures using planar structure layouts. In operation 13, a first layout is received. The planar structure layout includes defined active regions having sides. FIG. 2 illustrates a portion of a layout including active regions 63-68. The active regions 63-68 are regions of a substrate where transistors (not illustrated) of the example semiconductor device will be formed. It is understood that the active regions 63-68 are merely examples for the sake of facilitating ensuing discussions, and that any number of other active regions may be included in the first layout, and they may have shapes or geometries different from the active regions 63-68.

For the purpose of this disclosure, an active region defines the boundaries on which the fins of a FinFET can form. In operation 15 of FIG. 1, elongate mandrels are defined in each active region. Elongate mandrels are subsequently removed features next to which the spacers are deposited. These spacers are then used as hardmasks for etching underlying silicon to form fins. In some embodiments, the density of fins is maximized by placing the mandrels one spacer thickness away from the edge of the active region. A pitch of the mandrels is specified by the technology node, which defines the smallest feature size achievable. The mandrel pitch is equal to two times the fin pitch, and the mandrel width is about the same as fin spacing.

FIG. 2 also shows a plurality of gate electrode directions 73-78 associated with respective active regions 63-68. For active region 65, the gate electrode direction 75 is shown to be in the x direction as shown in FIG. 2. An elongate direction for the elongate mandrels is selected according to the gate electrode directions 73-78. The mandrels are typically oriented orthogonally, or about 90 degrees, to the gate electrode direction, though a different orientation is possible. For active region 65, for example, the elongate direction of the mandrels may be in the y direction, which is orthogonal to the gate direction 75.

The elongate mandrels may be placed in different active regions with the same pitch or different pitch. Starting from one side of an active region, a first elongate mandrel may be placed adjacent to the edge. From the first, or top, elongate mandrel, the next mandrel may be defined in parallel according to a minimum mandrel pitch. The minimum mandrel pitch is defined by the technology node to be the smallest pitch between features that can be manufactured. Each successive mandrel is spaced apart from one another in a direction perpendicular to the elongate direction according to the minimum mandrel pitch. In many cases, the mandrels are spaced apart in the same direction as the gate electrode. In this way, as mandrels are successively defined from one side of the active region to the opposite side of the active region, the last mandrel may or may not fit in the remaining space. In other words, an area at the opposite side of the active region may be left empty if the last mandrel does not fit. As result, the active region edge on the opposite side may not have a mandrel placed adjacent to the edge.

In some embodiments, the mandrels at the sides sharing the edge with the active regions are defined first, one at each end of the active region. In the space between the end mandrels, a maximum number of mandrels are defined in an equally spaced manner such that the mandrel pitch is not below the minimum mandrel pitch yet the same number of total mandrels in the active region is the same as if the minimum mandrel pitch is used. In other words, the procedure would calculate the total integer number of mandrels that can fit using the minimum mandrel pitch and define the integer number within the active region in an equally spaced manner. In these embodiments, the mandrels pitch may be larger than the minimum mandrel pitch with the same fin density. This embodiment maximizes the number of mandrels in the active region.

In still other embodiments, the number of fins is maximized rather than the number of mandrels. As noted above, the fins are formed by using spacers as hardmasks. Each mandrel results in two fins. If the length of an active region divided by the mandrel pitch results in a decimal number of mandrels that would fit in one active region has a fractional part larger than 0.5, then one additional fin may be included. The additional fin would be formed by a mandrel located outside of the active region instead of inside of the active region. Because locating the mandrel outside of the active region would form an extra spacer and perhaps an extra fin, the extra spacer or fin must be removed in a subsequent process.

In operation 17 of FIG. 1, a minimum distance between nearest sides of adjacent pairs of partially-parallel active regions is determined. FIG. 2 illustrates various relationships between active regions. For example, active regions 65/66, 66/67, 66/63, 63/64, and 67/68 are adjacent pairs. For the purpose of this disclosure, active regions 66/68 or 64/67 are not adjacent pairs. Partially-parallel active regions have mandrels that are parallel to each other and at least partially overlapping nearest sides. For example, active regions 65 and 66 are partially-parallel. Because both 75 and 76 are oriented in the x direction, their mandrels are both oriented in the y direction. Hence the mandrels are parallel. Their nearest sides, the right side of 65 and left side of 66 partially overlap in the x direction, as shown by the hatched area 71 illustrating an overlapping intermediate region 71 between the two adjacent pairs of partially-parallel active regions 65 and 66. In the same way, active regions 66/67, 64/68 and 67/68 are also partially-parallel. However, active regions 63/66 and 63/64 are not partially-parallel because mandrels within these adjacent active regions are oriented orthogonally from each other, although a portion of the nearest sides does overlap.

It is well known that the minimum distance between parallel line segments is the length of a line segment connecting at right angles to the parallel segments. The minimum distance between active regions 65 and 66 is 81. FIG. 2 shows various minimum distances 82 (66/67), 83 (66/63), 84 (63/64), 85 (64/68), and 86 (67/68).

When the minimum distance between nearest sides of adjacent pairs of partially-parallel active regions is below a certain lithography defined minimum spacing, various problems can occur. A pattern forming the mandrels in one active region can interfere with another pattern forming the mandrels in another region. Various optical proximity correction (OPC) methods for enhancing the pattern can increase the possibility of interference by moving the exposed areas even closer together. One possible result is an unintended bridge between two or more mandrels. The bridge may cause electrical abnormalities. Another possible result is particles from irregularly shaped mandrel ends.

In cases where an adjacent active region pair has a minimum distance less than the minimum spacing, the mandrels in the overlapping region are connected in operation 19 of FIG. 1 in accordance with various embodiments of the present disclosure. The specified minimum spacing is related to particular lithography techniques used, the type of feature to be formed, the lithography materials used, and technology node. In addition to a minimum spacing requirement applying to the distance between nearest sides of the active regions, other types of distance limitations may be used. For example, the end-to-end distance between mandrels across the overlapping region may be used instead. Because the mandrels may be unaligned across the overlapping region, the end-to-end or corner-to-corner distance between two of the nearest mandrels across the overlapping region may be larger than the minimum distance.

Figure 3:
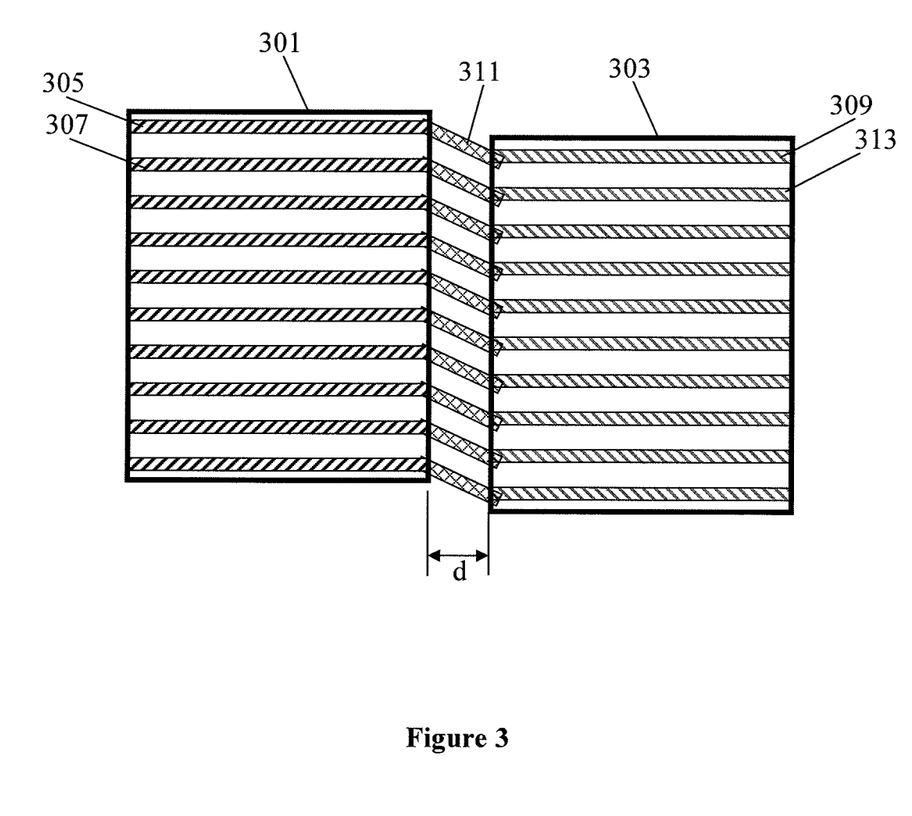
FIG. 3 illustrates a misaligned fin configuration and connective elements according to various embodiments of the present disclosure.
Figure 4:
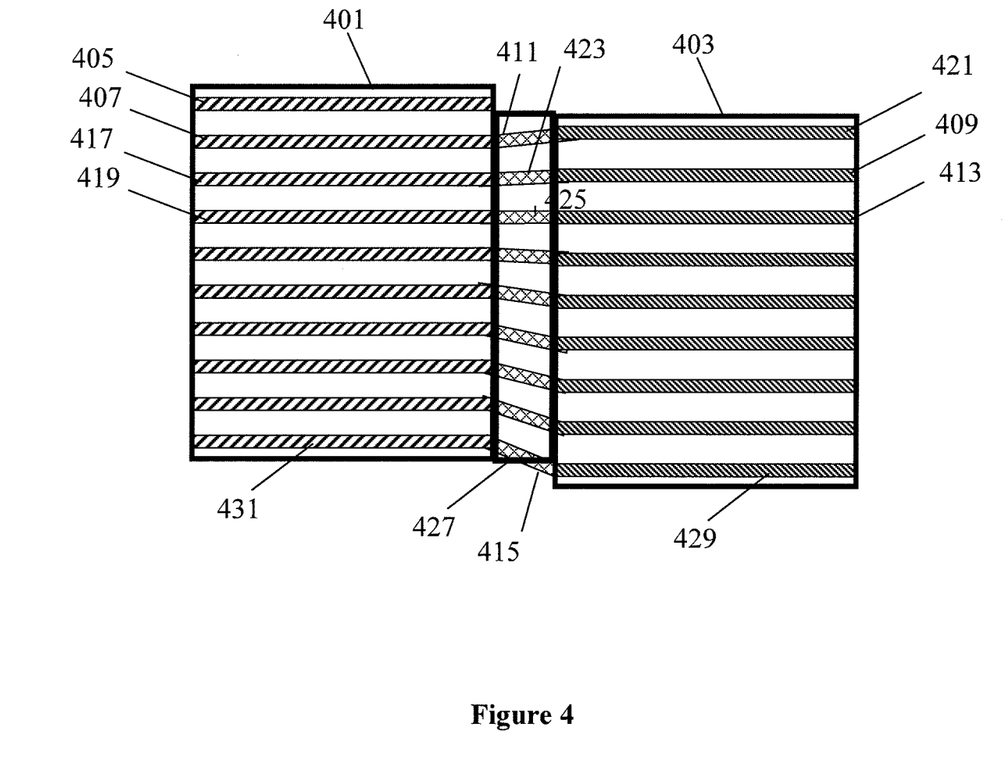
FIG. 4 illustrates an unequal pitch configuration and connective elements according to various embodiments of the present disclosure.
Figure 5:
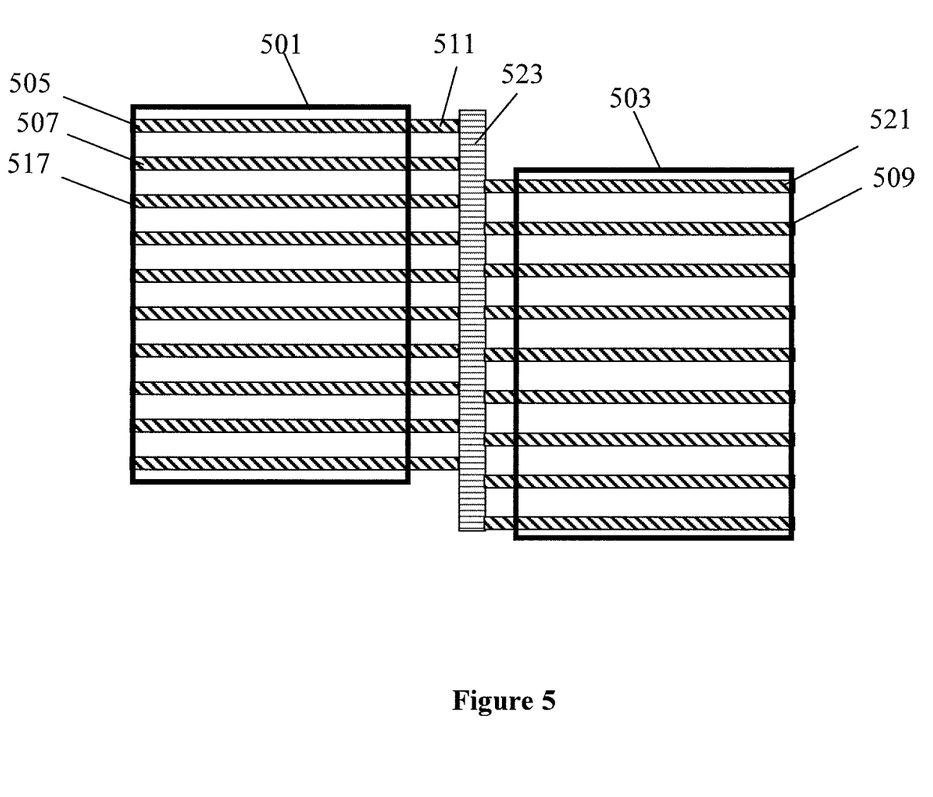
FIG. 5 illustrates an unequal pitch configuration and connective elements according to various embodiments of the present disclosure.

FIGS. 3-5 show various ways the mandrels may be connected. FIG. 3 illustrate two active regions 301 and 303 with a minimum distance "d" between the nearest sides that is less than a specified minimum spacing. The number of mandrels and mandrel pitch are the same in active regions 301 and 303. A connective element 311 is added to connect ends of mandrel 305 and 309. Successive connective elements are added to connect ends of the succeeding mandrels in each active region. Note that because the mandrel pitches are the same in active regions 301 and 303, the connective elements have the same orientation relative to the mandrels. The connective element 311 has a width not greater than either mandrel between which the connective element connects. In many cases, the connective element has a width that is the same as one or both of the mandrels.

In some embodiments, the mandrels to which the connective elements connect are selected to maximize the acute angle between the connective element and the mandrel. In other words, for horizontal mandrels, the mandrels are chosen so that the connective element is as horizontal as possible to simplify the photolithography operations used to form the connective elements. For example, in FIG. 3, the connective element 311 may connect mandrels 309/305 as shown or 309/307 instead, forming a different angle with the mandrels. Various photolithography operations may limit an angular range for forming the connective elements, for example, to simplify any OPC operations. In certain embodiments, the connective element between mandrel ends is curved instead of straight. The curved connective element may require less OPC processing to produce. Because the connective elements are ultimately removed in subsequent processing, any particular shape may be used as long as no adverse electrical properties result.

FIG. 4 shows a situation where each of an adjacent pair of partially-parallel active regions have different mandrel pitches. With different mandrel pitches, choosing the mandrels between which to make the first connective element connection becomes important because pitch differences will vary the mandrel to connective element angle from connective element to connective element. Where the lithography process limits the range of angles, a next connective element may form an unacceptable angle with one of the mandrels.

FIG. 4 shows a number of connective elements, for example, 411, 415, 423, and 425. According to various embodiments, the end to end distance between various mandrels are determined, and the mandrel pair having a shortest distance between their ends is selected, for example in FIG. 4, the shortest distance between two mandrel ends is that between mandrels 419 and 413, connected by connective element 425. Starting from the mandrel pair 419/413, a connective element is attached to successive ends of each pair of mandrels across the nearest sides (for example, between 417 and 409, between 407 and 421) within the partially-parallel portion (427) of the adjacent pair of partially-parallel active regions 401 and 403. Note that the angle from horizontal increases with respect to further connective elements as compared to the shortest connective element 425. In certain cases, the next connective element may have an angle that cannot be accommodated by the lithography process. In those cases one mandrel should be skipped to form a more horizontal connective element. This embodiment would connect the most number of mandrels without exceeding the lithography angular range for forming the connective elements. Note also mandrel 405 is not connected to another mandrel because it is located outside of the partially-parallel portion 427. While mandrel 429 is located outside of the partially-parallel portion 427, it is optionally connected to mandrel 431 via connective element 415 because mandrel 431 to which it connected is within the partially-parallel portion 427.

FIG. 5 shows yet another connective element configuration in accordance with various embodiments of the present disclosure. In FIG. 5, a central connective element 523 is used with a number of branch connective elements 511 to connect the mandrels from active region 501 to the mandrels from active region 503. In these embodiments, a central connective element is placed in the region between the active regions in a perpendicular direction to the mandrels, or, as usually oriented, parallel to the gate electrode. The mandrels are then extended in a branch connective element toward the central connective element until they connect to the central connective element. In these embodiments, whether the mandrels in the adjacent active regions have the same mandrel pitch is not important, because the branch connective elements connect to the central connective element in the same way, at right angles. Note that it is not necessary that the central connective element is placed in the middle of the partially-parallel portion. FIG. 5 shows mandrel ends from portions outside of the partially-parallel portion connecting to the central connective element. In some embodiments, the central connective element does not extend past the partially-parallel portion and mandrel 505 would not be connected to the central connective element. In certain embodiments, the central connective element has a width not greater than two times that of mandrels in the adjacent pair of partially-parallel active regions to avoid local loading effects. In some embodiments, the central connective element has a width that is between one mandrel width and three mandrel pitches.

Figure 6:
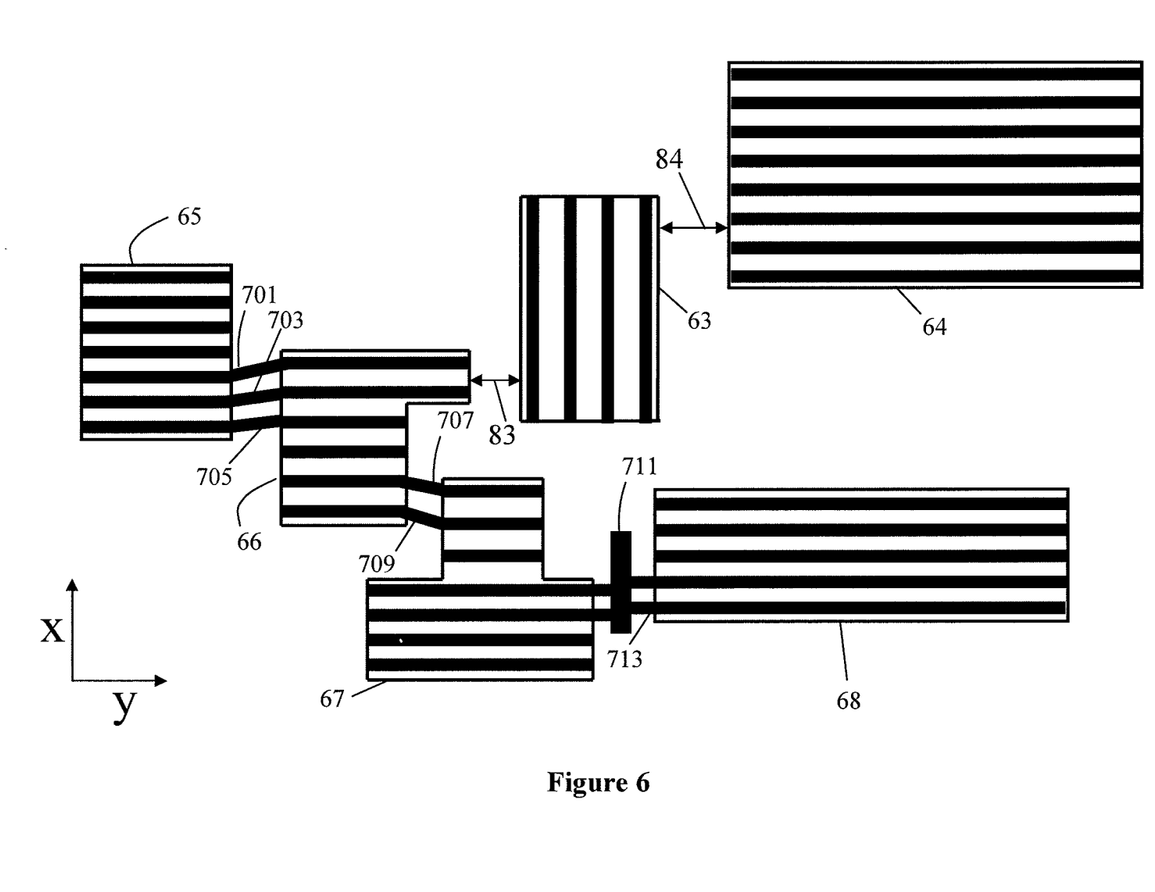
FIG. 6 illustrates various connective elements and layout conversion methods applied to the layout of FIG. 2 according to various embodiments of the present disclosure.

FIG. 6 illustrates a possible layout conversion applied to layout of FIG. 2 using the various embodiments in this disclosure. Relationships between each adjacent active region pair and resulting connective elements are discussed in turn. Referring to FIG. 2, active regions 65 and 66 are adjacent and partially-parallel with a partially-parallel portion/region 71. The minimum distance 81 between the nearest sides is less than a specified minimum spacing. Referring to FIG. 6, connective elements 701, 703, and 705 are formed between the mandrels in the active regions 65 and 66 in the partially-parallel portion. Because the mandrel pitches are different, the connecting starts at the shortest mandrel end/end distance for connective element 705. From there, adjacent mandrels are connected as long as the angle is not limited by the photolithography process. Similarly to active regions 65 and 66, the partially-parallel region between active regions 66 and 67 are connected by connective elements 707 and 709.

As between active regions 66 and 63 and active regions 63 and 64, while the minimum distances 83 and 84 between the nearest sides are smaller than the specified minimum spacing for adjacent pairs of partially-parallel active regions, no connection is made because active region pairs are not partially-parallel since their mandrels are oriented orthogonal to each other. Note that the specified minimum distance only applies to distance between nearest sides of adjacent active regions where mandrels end. There is a different minimum value for 83 and 84 (mandrel end to run) below which the mandrel structures in adjacent active regions 66/63 and 63/64 cannot be formed. This different value is usually, but not always, less than the specified minimum spacing between the partially-parallel active regions, which would be mandrel end to end. Thus while no connective element is required between active regions 66 and 63 and between active regions 63 and 64 in accordance with various embodiments of the present disclosure, nevertheless other design rules may come into play regarding the spacing of these regions. On the other hand, active regions 64 and 68 are not partially-parallel because there are no overlapping regions even though the mandrels are parallel.

Connective elements between active regions 67 and 68 illustrate yet another embodiment of the present disclosure. Referring to FIG. 2, the minimum distance 86 between active regions 67 and 68 is greater than the specified minimum spacing; therefore, no connective element needs to be added in the partially-parallel region. However, as an option, the distance between active regions 67 and 68 can be reduced to less than or at the specified minimum spacing. By reducing the distance between various active regions, the size of the die may be reduced. Of course, once the minimum distance is reduced to below that of the specified minimum spacing, connective elements such as central connective element 711 and branch connective elements 713 are added as shown. Note that the decision whether to allow moving the active regions may also depend on the importance of reusing photomasks from other layers because the changed active region may result in different layouts in other layers.

Figure 7:
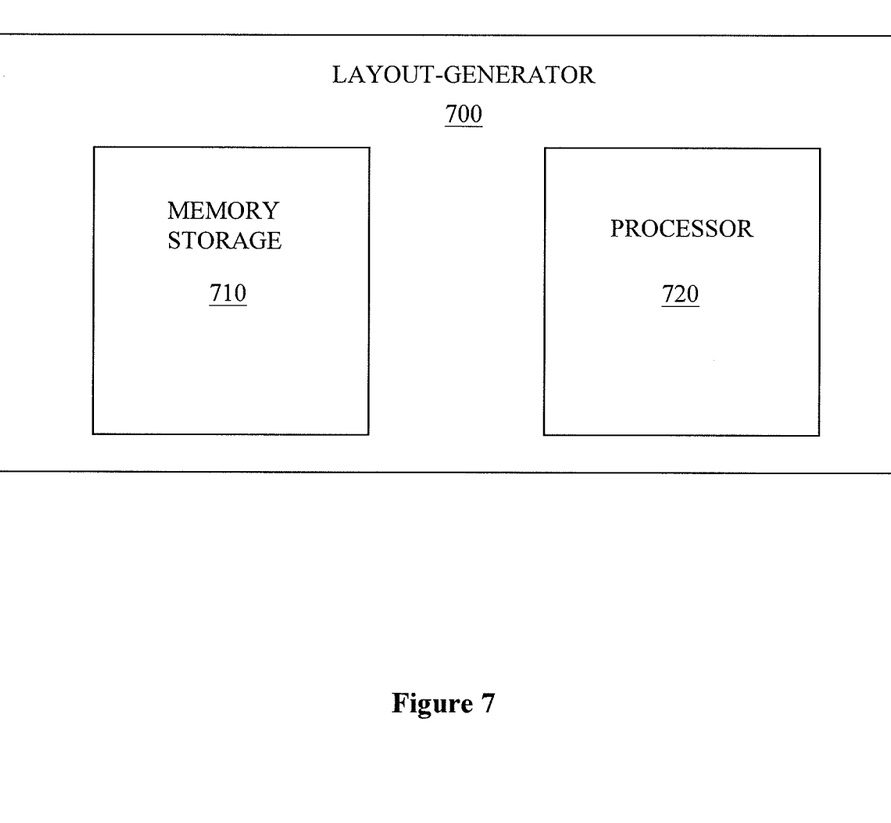
FIG. 7 is a simplified diagrammatic view of a machine that can be used to generate the layout in accordance with aspects of the present disclosure.

FIG. 7 is a simplified diagrammatic view of a layout-generator 700 (or layout-generating machine). The layout-generator 700 includes a machine or tool that can be used to perform the layout conversion process discussed above in association with various figures. In an embodiment, the layout generator 700 includes a memory storage component 710 and a processor component 720. The memory storage component 710 is a non-transitory, tangible computer readable storage medium. For example, the computer readable storage medium may include a hard drive or a CD-ROM. The computer readable storage medium may be implemented as part of a single work station or may be implemented as part of a centralized server.

The computer readable storage medium stores instructions that can be executed by the processor 720. These instructions contain algorithms used to carry out the various steps of converting an initial layout having planar devices to a layout having FinFET devices, as discussed above. In one embodiment, the instructions contain these following algorithms that may each be implemented as part of a computer program. One such algorithm is implemented to carry out defining in each of the plurality of active regions a plurality of elongate mandrels that each extend in a first direction and are spaced apart from one another in a second direction perpendicular to the first direction. Another algorithm is implemented to carry out determining a minimum distance in the first direction between nearest sides between adjacent pairs of partially-parallel active regions. Yet another algorithm is implemented to carry out for each adjacent pair of partially-parallel active regions having a minimum distance less than a specified minimum spacing, connecting at least a portion of nearest ends of pairs of elongate mandrels from the adjacent pair of partially-parallel active regions. One more algorithm is implemented to carry out generating a second layout using a layout-generating machine, said second layout including the plurality of active regions, a plurality of elongate mandrels in the plurality of active regions, and connective elements between active regions of at least one adjacent pairs of partially-parallel active regions.

The instructions containing these algorithms are fetched from the computer readable storage medium to the processor component 720 for execution. After execution, the processor component 720 generates a new layout having FinFET devices. In other words, the planar devices from the initial layout are converted into the FinFET devices in the new layout through the execution of the instructions containing the above-mentioned algorithms. The new layout having FinFET devices may be stored in the memory storage component 710. It is understood that additional algorithms may be included in the instructions as part of this layout conversion process. These additional algorithms correspond to the various methods described above. It is also understood that the new layout having FinFET devices may be sent to a photomask fabricator so that photomasks corresponding to the new layout may be produced.

The embodiments of the present disclosure discussed herein offer several advantages, it being understood that other embodiments may offer different advantages, and that no particular advantage is required for any embodiment. For example, any given layout (such as a planar device layout) can be automatically converted into a FinFET device layout using the methods discussed herein. The entity (e.g., a design house) that generates the initial layout need not have the necessary tools to perform a FinFET layout and need not worry about meeting FinFET design rules. The entity (e.g., a foundry) that performs the above-described layout conversion will take care of the layout conversion from planar devices to FinFET devices in a seamless fashion. This enables the entity that generates the initial layout to have greater flexibility in performing the initial layout.

One aspect of this description relates to a semiconductor manufacturing method of generating a layout for a device. The method includes receiving a first layout, the first layout including a plurality of active regions, each active region of the plurality of active regions having sides. The method further includes for each of the plurality of active regions, defining a plurality of elongate mandrels that each extend in a first direction and are spaced apart from one another in a second direction perpendicular to the first direction. The method further includes for each adjacent pair of partially-parallel active regions of the plurality of active regions having a minimum distance less than a specified minimum spacing, connecting at least a portion of nearest ends of pairs of elongate mandrels, each mandrel of a pair from a different active region of the adjacent pair of partially-parallel active regions. The method further includes generating a second layout using a layout-generating machine, said second layout including the plurality of active regions, a plurality of elongate mandrels in the plurality of active regions, and connective elements between active regions of at least one adjacent pair of partially-parallel active regions.

Another aspect of this description relates to a device. The device includes a first mandrel associated with a first active region and a second mandrel associated with a second active region. The second mandrel is parallel to the first mandrel, wherein a first distance between the first active region and the second active region in a first direction is equal to or less than a minimum spacing. A second distance between the first mandrel and the second mandrel perpendicular to the first direction is less than the minimum spacing. The device further includes at least one connective element between the first mandrel and the second mandrel.

Still another aspect of this description relates to a layout generator. The layout generator includes a processor and a memory storage component configured to store instructions. The stored instructions are for executing receiving a first layout, the first layout including a plurality of active regions, each active region of the plurality of active regions having sides. The stored instructions are further for executing for each of the plurality of active regions, defining a plurality of elongate mandrels that each extend in a first direction and are spaced apart from one another in a second direction perpendicular to the first direction. The stored instructions are further for executing for each adjacent pair of partially-parallel active regions of the plurality of active regions having a minimum distance less than a specified minimum spacing, connecting at least a portion of nearest ends of pairs of elongate mandrels, each mandrel of a pair from a different active region of the adjacent pair of partially-parallel active regions. The stored instructions are further for executing generating a second layout using a layout-generating machine, said second layout including the plurality of active regions, a plurality of elongate mandrels in the plurality of active regions, and connective elements between active regions of at least one adjacent pair of partially-parallel active regions.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor manufacturing method of generating a layout for a device, comprising:
   for each of a plurality of active regions of a first layout, defining a plurality of elongate mandrels that each extend in a first direction and are spaced apart from one another in a second direction perpendicular to the first direction, each active region of the plurality of active regions having sides;
   for each adjacent pair of partially-parallel active regions of the plurality of active regions having a minimum distance less than a specified minimum spacing, connecting at least a portion of nearest ends of pairs of elongate mandrels, each mandrel of a pair from a different active region of the adjacent pair of partially-parallel active regions; and,
   generating a second layout using a layout-generating machine, said second layout including the plurality of active regions, a plurality of elongate mandrels in the plurality of active regions, and connective elements between active regions of at least one adjacent pair of partially-parallel active regions.

2. The method of claim 1, wherein connecting the at least a portion of nearest ends of pairs of elongate mandrels comprises maximizing an obtuse angle between a connective element and each mandrel of the pairs of elongate mandrels.

3. The method of claim 1, wherein connecting the at least a portion of nearest ends of pairs of elongate mandrels comprises inserting a connective element extending in a third direction different from the first direction.

4. The method of claim 1, further comprising:
connecting a portion of nearest ends of a first pair of elongate mandrels using a first conductive element extending in a third direction; and
connecting a portion of nearest ends of a second pair of elongate mandrels using a second conductive element extending in a fourth direction different from the third direction.

5. The method of claim 1, wherein the first layout includes a plurality of fins having a fin pitch in each active region of the plurality of active regions, and defining the plurality of elongate mandrels comprises defining the plurality of elongate mandrels to have a mandrel pitch, the mandrel pitch is greater than the fin pitch.

6. The method of claim 1, wherein the first layout includes a plurality of fins in each active region of the plurality of active regions, wherein a space between each fin of the plurality of fins has a fin spacing, and defining the plurality of elongate mandrels comprises defining the plurality of elongate mandrels to have a mandrel width, wherein the mandrel width is substantially equal to the fin spacing.

7. The method of claim 1, wherein defining the plurality of elongate mandrels comprises:
defining a first set of mandrels in a first active region of the plurality of active regions, the first set of mandrels having a first mandrel pitch; and
defining a second set of mandrels in a second active region of the plurality of active regions, the second set of mandrels having a second mandrel pitch different from the first mandrel pitch.

8. A photomask comprising:
a first mandrel associated with a first active region;
a second mandrel associated with a second active region, the second mandrel is parallel to the first mandrel, wherein a first distance between the first active region and the second active region in a first direction is equal to or less than a minimum spacing; and
at least one connective element between the first mandrel and the second mandrel.

9. The photomask of claim 8, wherein the at least one connective element extends at an acute angle with respect to the first direction.

10. The photomask of claim 8, wherein the at least one connective element comprises:
a first conductive element extending in a third direction; and
a second conductive element extending in a fourth direction.

11. The photomask of claim 10, wherein the third direction is different from the fourth direction.

12. The photomask of claim 8, further comprising a third mandrel associated with the first active region, wherein the first active region includes a plurality of fins having a fin pitch, and a distance between the first mandrel and the third mandrel is greater than the fin pitch.

13. The photomask of claim 8, wherein the first active region comprises a first fin spaced from a second fin by a fin spacing, and the first mandrel has a mandrel width, and the mandrel width is substantially equal to the fin spacing.

14. The photomask of claim 8, wherein the first mandrel is part of a first set of mandrels in a first active region, the first set of mandrels having a first mandrel pitch, and
the second mandrel is part of a second set of mandrels in the second active region, the second set of mandrels having a second mandrel pitch different from the first mandrel pitch.

15. A layout generator, comprising:
a processor; and
a memory storage component configured to store instructions for executing the following steps:
receiving a first layout, the first layout including a plurality of active regions, each active region of the plurality of active regions having sides;
for each of the plurality of active regions, defining a plurality of elongate mandrels that each extend in a first direction and are spaced apart from one another in a second direction perpendicular to the first direction;
for each adjacent pair of partially-parallel active regions of the plurality of active regions having a minimum distance less than a specified minimum spacing, connecting at least a portion of nearest ends of pairs of elongate mandrels, each mandrel of a pair from a different active region of the adjacent pair of partially-parallel active regions; and
generating a second layout using a layout-generating machine, said second layout including the plurality of active regions, a plurality of elongate mandrels in the plurality of active regions, and connective elements between active regions of at least one adjacent pair of partially-parallel active regions.

16. The layout generator of claim 15, wherein the memory storage components is further configured to store instructions for connecting the at least a portion of nearest ends of pairs of elongate mandrels comprises maximizing an obtuse angle between a connective element and each mandrel of the pairs of elongate mandrels.

17. The layout generator of claim 15, wherein the memory storage components is further configured to store instructions for connecting the at least a portion of nearest ends of pairs of elongate mandrels comprises inserting a connective element extending in a third direction different from the first direction.

18. The layout generator of claim 15, wherein the memory storage components is further configured to store instructions for:
connecting a portion of nearest ends of a first pair of elongate mandrels using a first conductive element extending in a third direction; and
connecting a portion of nearest ends of a second pair of elongate mandrels using a second conductive element extending in a fourth direction different from the third direction.

19. The layout generator of claim 15, wherein the memory storage components is further configured to store instructions for defining the plurality of elongate mandrels to have a mandrel pitch, the mandrel pitch is greater a the fin pitch, wherein the first layout includes a plurality of fins having the fin pitch in each active region of the plurality of active regions.

20. The layout generator of claim 15, wherein the memory storage components is further configured to store instructions for:
defining a first set of mandrels in a first active region of the plurality of active regions, the first set of mandrels having a first mandrel pitch; and defining a second set of mandrels in a second active region of the plurality of active regions, the second set of mandrels having a second mandrel pitch different from the first mandrel pitch.

* * * * *